US006686625B2

(12) United States Patent
Tihanyi

(10) Patent No.: US 6,686,625 B2
(45) Date of Patent: Feb. 3, 2004

(54) FIELD EFFECT-CONTROLLABLE SEMICONDUCTOR COMPONENT WITH TWO-DIRECTIONAL BLOCKING, AND A METHOD OF PRODUCING THE SEMICONDUCTOR COMPONENT

(75) Inventor: Jenoe Tihanyi, Kirchheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/010,503

(22) Filed: Dec. 5, 2001

(65) Prior Publication Data

US 2002/0093049 A1 Jul. 18, 2002

(30) Foreign Application Priority Data

Dec. 5, 2000 (DE) .......................................... 100 60 428

(51) Int. Cl.[7] .............................................. H01L 29/76
(52) U.S. Cl. ..................... 257/331; 257/329; 257/330; 438/270; 438/271; 438/588; 438/587
(58) Field of Search ................................ 257/329, 330, 257/331; 438/212, 259, 270, 271, 589

(56) References Cited

U.S. PATENT DOCUMENTS 5,696,396 A    12/1997  Tokura et al. ............... 257/341

6,239,463 B1 *  5/2001  Williams et al. ............ 257/328
2002/0088989 A1 *  7/2002  Kim ............................ 257/135

FOREIGN PATENT DOCUMENTS

EP        0 656 661 A1     11/1994

* cited by examiner

*Primary Examiner*—Nathan J. Flynn
*Assistant Examiner*—Scott Wilson
(74) *Attorney, Agent, or Firm*—Laurence A. Greenberg; Werner H. Stemer; Gregory L. Mayback

(57) ABSTRACT

The semiconductor component can be controlled by the field effect and it blocks in both directions. The component has a semiconductor body with a first connecting zone, a second connecting zone and a channel zone formed between the first and the second connecting zone. A control electrode is formed adjacent to the channel zone such that it is isolated from the semiconductor body. In order to avoid a reduction in the withstand voltage due to a parasitic bipolar transistor, a recombination zone, which is formed from a material that assists the recombination of charge carriers of the first and second conductivity types, is formed in the channel zone and the second connecting zone.

15 Claims, 9 Drawing Sheets

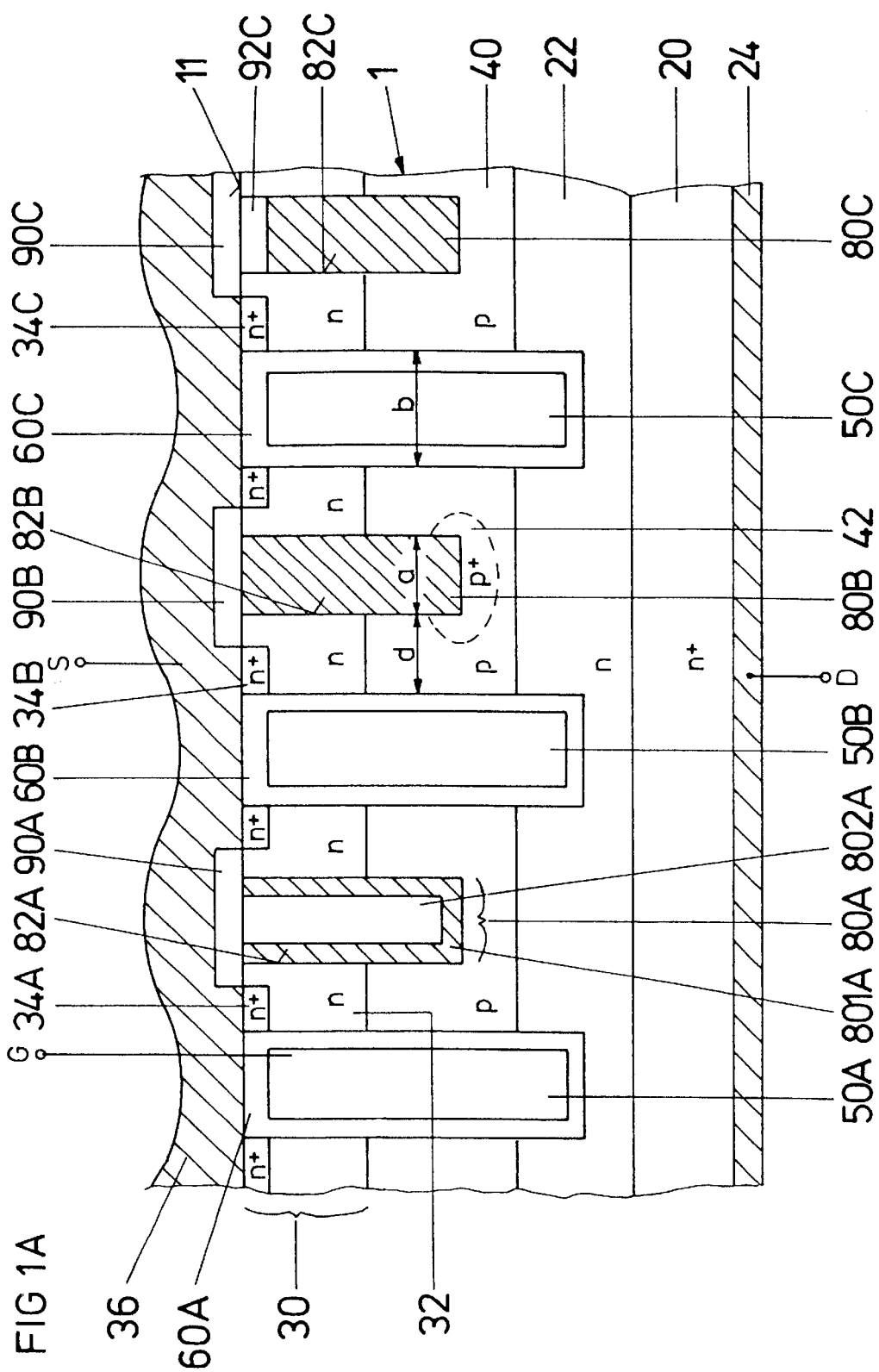

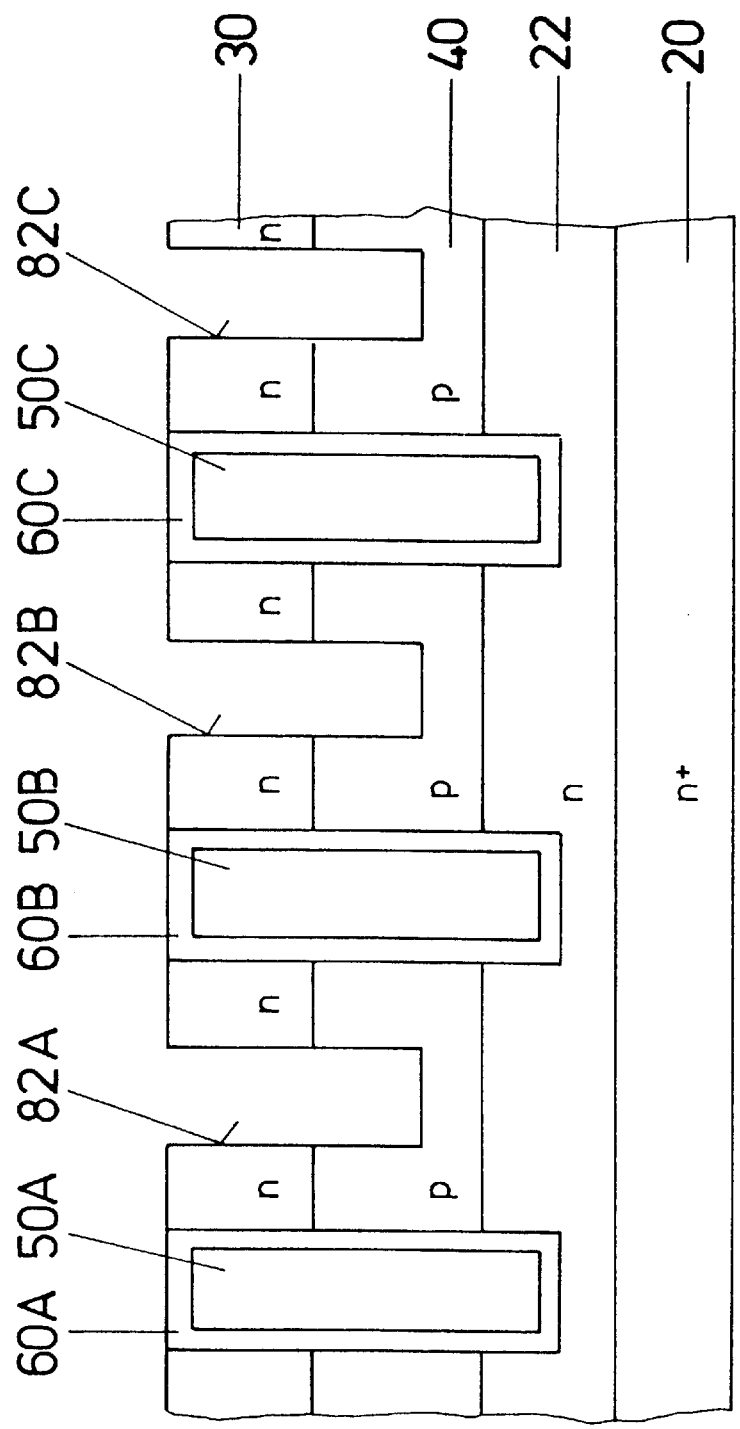

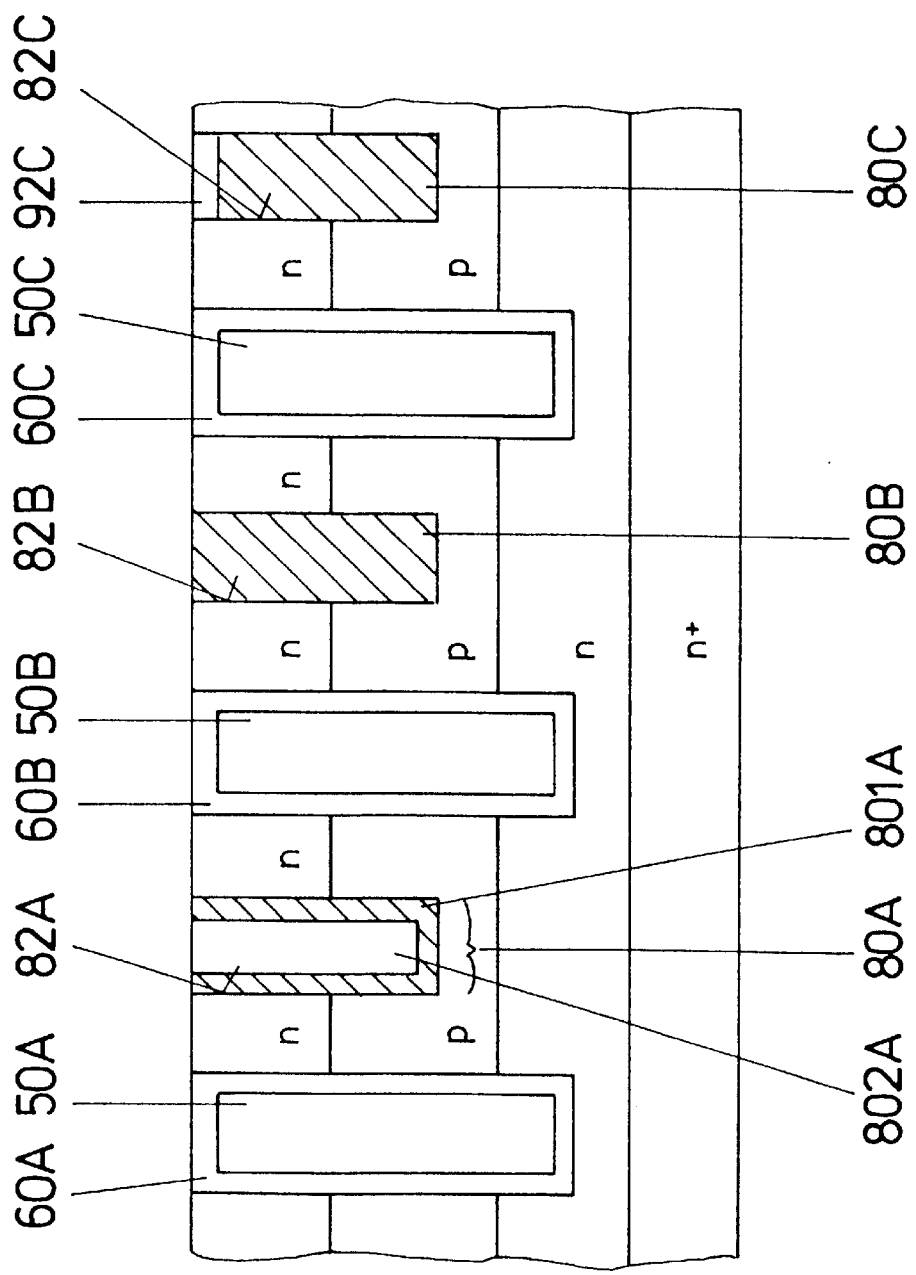

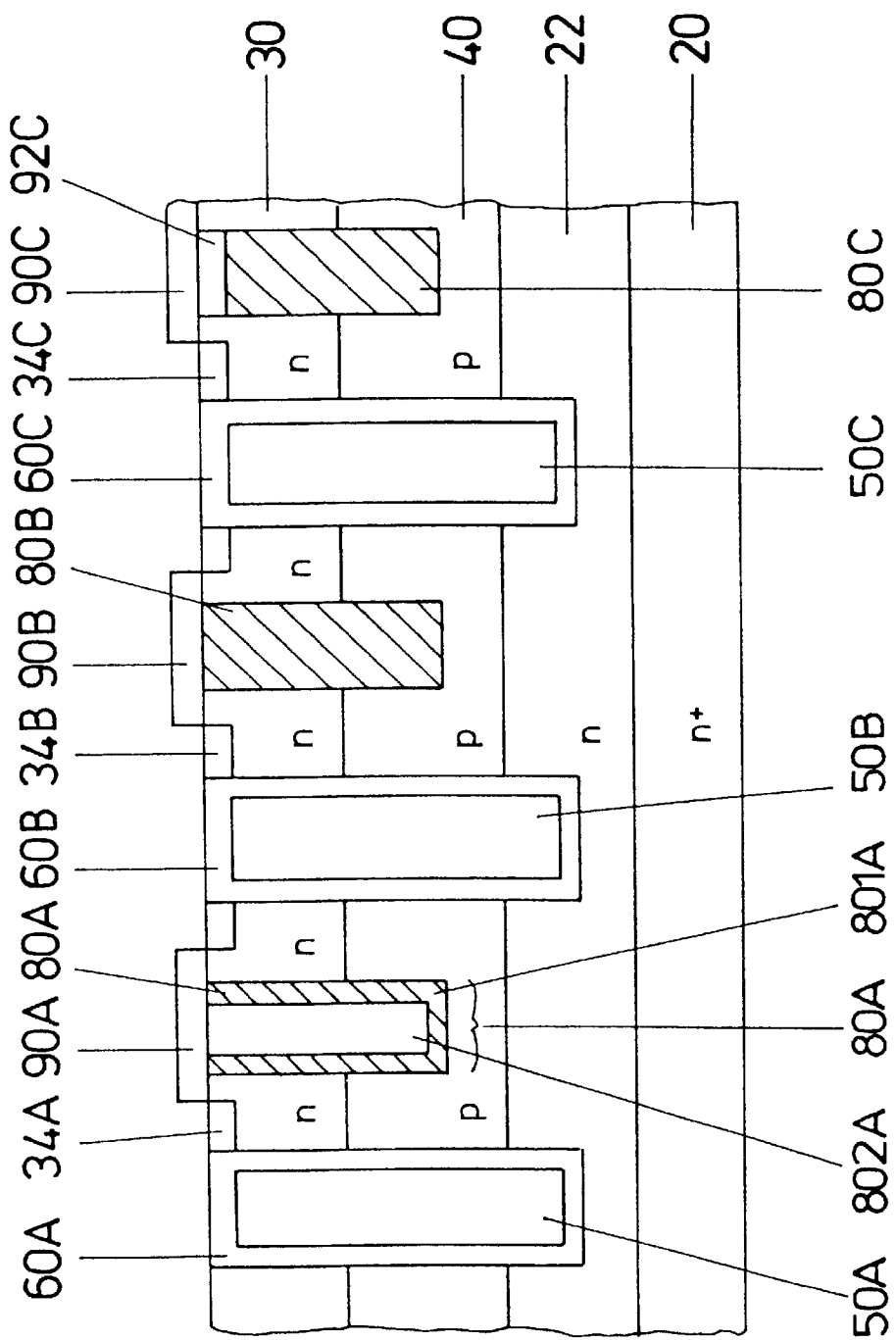

FIELD EFFECT-CONTROLLABLE SEMICONDUCTOR COMPONENT WITH TWO-DIRECTIONAL BLOCKING, AND A METHOD OF PRODUCING THE SEMICONDUCTOR COMPONENT

BACKGROUND OF THE INVENTION

Field of the Invention

The invention lies in the semiconductor technology field. More specifically, the present invention relates to a semiconductor component which can be controlled by means of the field effect and which blocks in both directions, as well as to a method for its production.

Semiconductor components which can be controlled by means of the field effect, for example MOSFETs (Metal Oxide Semiconductor Field Effect Transistors), have been known for a long time, for switching currents and for applying voltages to loads. Components of this type have a semiconductor body with first and second doped connecting zones and a channel zone, which is doped in a complementary manner to the first and second connecting zones and is formed between the first and second connecting zones. A control electrode is thereby formed such that it is isolated from the semiconductor body and extends, adjacent to the channel zone, between the first and the second connecting zone. In the case of MOSFETs, the first and second connecting zones form source and drain zones of the component. The channel zone is also referred to as the body region of the component.

A distinction is drawn between MOSFETs of lateral construction and MOSFETs of vertical construction, depending on whether the contact is made with the source and drain zones on one side of the semiconductor body or on opposite sides of the semiconductor body. Stengl and Tihanyi, in "Leistungs-MOSFET-Praxis" [Power MOSFET Practice], Pflaum Verlag Munich, 1992, page 36, FIG. 2.2.1B describe a vertical MOSFET, wherein a heavily n-doped drain zone, a p-doped channel zone, and a heavily n-doped source zone are arranged one above the other. Furthermore, a more weakly n-doped drift zone is formed between the heavily n-doped drain zone and the channel zone. Contact is made with the source zone and the drain zone on opposite sides of the semiconductor body, and a number of gate electrodes extend in trenches in the semiconductor body from the source zone through the channel zone into the drift zone, with the gate electrodes being isolated from the semiconductor body by layers of an insulation material. A MOSFET of lateral construction is described in FIG. 2.1 on page 29 of the cited publication, wherein heavily n-doped wells are arranged spaced apart in the semiconductor body and are used as the source zone and drain zone of the component. A gate electrode is arranged on the semiconductor body such that it is isolated by an oxide layer, and extends in the lateral direction from the source zone to the drain zone.

The sequence of the differently doped zones that exist in the described components, namely a source zone and a drain zone of the same conductivity type and a channel zone which is doped in a complementary manner to the source zone and the drain zone, means that there is always a parasitic bipolar transistor in elements such as these, whose base is formed by the channel zone, and whose emitter and collector are formed by the source zone and drain zone, respectively. In order to prevent this parasitic bipolar transistor from affecting the withstand voltage of the component, it is normal for the source zone and channel zone to be short-circuited, as can also be found in the exemplary embodiments of MOSFETs according to the prior art described above.

If the source zone and the channel zone were not short-circuited, charge carriers could accumulate in the channel zone during operation, that is to say when a drive potential is applied to the gate electrode and a forward voltage is applied between the drain zone and the source zone, and these would activate the parasitic bipolar transistor, resulting in a considerable reduction in the withstand or blocking voltage of the MOSFET. The withstand voltage of such a MOSFET in the drain-source direction is only about ⅓ of the withstand voltage of a MOSFET with a short-circuited channel and source zone, wherein the short circuit results in the source zone and the channel zone always being at the same potential, so that no charge carriers can accumulate in the channel zone.

The short-circuiting of the source zone to the channel zone has the disadvantage, however, that the component can now block in only one direction, the drain-source direction, which is normally referred to as the forward direction, while it acts like a diode when a forward voltage is applied in the source-drain direction (reverse direction).

However, in many applications, it is desirable to use a semiconductor component which can be controlled by means of the field effect and can block in both directions when no drive potential is applied. In conventional MOSFETs with a short circuit between the source zone and the channel zone, this can be achieved only by complex additional circuitry measures.

U.S. Pat. No. 5,696,396 (European patent EP 0 656 661 B1) proposes that the short circuit be replaced by a conductive connection with a resistance, in order to increase the voltage drop across the component when a voltage is applied in the rearward direction.

SUMMARY OF THE INVENTION

It is accordingly an object of the invention to provide a field-effect controllable semiconductor body and a corresponding fabrication method, which overcome the above-mentioned disadvantages of the heretofore-known devices and methods of this general type and which semiconductor component blocks in both directions and can be produced easily using conventional fabrication means.

With the foregoing and other objects in view there is provided, in accordance with the invention, a field effect-controlled semiconductor component, comprising:

a semiconductor body having a first connecting zone and a second connecting zone of a first conductivity type, and having a channel zone of a second conductivity type formed between the first connecting zone and the second connecting zone;

a control electrode adjacent the channel zone and isolated from the semiconductor body; and a recombination zone formed in the channel zone and in the second connecting zone and having a recombination material assisting in a recombination of charge carriers of the first and the second conductivity types.

In other words, the novel semiconductor component has a semiconductor body with a first and a second connecting zone of a first conductivity type, and a channel zone of a second conductivity type, which is formed between the first and the second connecting zone. A control electrode is arranged adjacent to the channel zone, such that it is isolated from the semiconductor body. Furthermore, a recombination zone is formed in the channel zone and in the second connecting zone, and has a material which assists the recombination of charge carriers of the first and second conductivity types.

There is no short circuit between one of the two connecting zones and the channel zone in the semiconductor component according to the invention. The semiconductor component according to the invention thus blocks in both directions. The recombination zone in the channel zone prevents activation of a parasitic bipolar transistor which is formed by the sequence of the first connecting zone of the first conductivity type, the second connecting zone of the second conductivity type, and the second connecting zone of the first conductivity type. Specifically, the recombination zone means that charge carriers of the second conductivity type which are injected into the channel zone recombine on the surface of the recombination zone with charge carriers of the first conductivity type, thus preventing accumulation of charge carriers of the second conductivity type in the channel zone.

The recombination zone is preferably composed of a metal, in particular of platinum, or a nitride.

The first connecting zone, the channel zone and the second connecting zone are preferably arranged one above the other in the semiconductor body. In this embodiment, the control electrode is formed in a trench in the semiconductor body, which, starting from one surface of the semiconductor body, extends through the second connecting zone and the channel zone into the first connecting zone.

Furthermore, a drift zone of the first conductivity type, which is more weakly doped than the first connecting zone, can be formed between the first connecting zone and the channel zone, with the control electrode extending only into this drift zone in this embodiment.

One embodiment of the invention provides for the recombination zone to extend in the vertical direction of the semiconductor body, starting from the surface of the semiconductor body, through the second connecting zone into the channel zone. The recombination zone is in this case arranged in a trench which extends into the semiconductor body, wherein case this trench can be completed filled with recombination material, or wherein case only those side surfaces of the trench which face the semiconductor body are covered with recombination material and, apart from this, the trench is filled with a further material, for example an insulation material. The recombination zone can be closed off at the top by one surface of the semiconductor body, or it can end in the trench underneath the surface of the semiconductor body.

The second connecting zone preferably has a first doped region and a second doped region, with the second doped region being doped more strongly than the first doped region and being arranged at a distance from the recombination zone. In this case, a portion of the more weakly doped first region is formed between the second doped region and the recombination zone. The second more strongly doped region is preferably formed adjacent to the insulation layer of the control electrode, and contact is made with it by means of a connecting electrode.

With the above and other objects in view there is also provided, in accordance with the invention, a method of producing a field effect-controllable semiconductor component. The novel method comprises the following method steps:

providing a semiconductor body with a first connecting zone of a first conductivity type, a second connecting zone of the first conductivity type, and a channel zone of a second conductivity type formed between the first and second connecting zones, and wherein the first connecting zone, the channel zone, and the second connecting zone are arranged one above the other;

producing a control electrode that is isolated from the semiconductor body and, starting from a surface of the semiconductor body, extends in a vertical direction into the semiconductor body; and producing a recombination zone starting from a surface of the semiconductor body and extending through the second connecting zone into the channel zone.

In other words, in the method for producing the semiconductor component, first of all, a semiconductor body with a first connecting zone of a first conductivity type, a second connecting zone of the first conductivity type and a channel zone, which is formed between the first and second connecting zone, of a second conductivity type are provided, with the first connecting zone, the channel zone and the second connecting zone being arranged one above the other in the semiconductor body. A control electrode is then produced, such that it is isolated from the semiconductor body and extends in the vertical direction of the semiconductor body into the semiconductor body. Furthermore, a recombination zone is produced, which extends in the vertical direction of the semiconductor body through the second connecting zone into the channel zone.

The semiconductor body that is provided may also have a drift zone of the first conductivity type, which is doped more weakly than the first connecting zone and is formed between the first connecting zone and the channel zone. If such a drift zone is present, then the control electrode is produced such that it extends from the first connecting zone through the channel zone to the drift zone.

In order to produce the control electrode, a trench is produced in the semiconductor body, with an insulation layer then being applied to exposed regions of the semiconductor body in the trench. After this, an electrode material is introduced into the trench, and this is then covered with an insulation layer.

A trench is likewise produced in the semiconductor body in order to produce the recombination zone. According to one embodiment of the method according to the invention, this trench is filled with a material which assists the recombination of charge carriers of the first and second conductivity types. According to a further embodiment of the method for producing the recombination zone, the invention provides for the trench not to be filled completely with recombination material but only for exposed areas of the semiconductor body in the trench to be covered with recombination material. Apart from this, the trench can then be filled with a different material, for example an insulation material.

In order to isolate the recombination zone in the trench at the top, an insulation layer is preferably applied to the surface of the semiconductor body, covering the trench and regions of the second connecting zone adjacent to the trench. This insulation layer is also used as a mask for a next method step, wherein a heavily doped zone is produced in the second connecting zone, with this heavily doped zone being used as a connection for an electrode.

Other features which are considered as characteristic for the invention are set forth in the appended claims.

Although the invention is illustrated and described herein as embodied in a semiconductor component which can be controlled by means of the field effect and blocks in both directions, and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A is a diagrammatic sectional side view of a semiconductor component according to the invention;

FIGS. 2A to 2I are diagrammatic sectional side views of a semiconductor component according to the invention, illustrating various method steps.

Unless stated to the contrary, identical reference symbols refer to equal and functionally identical parts throughout the figure.

DESCRIPTION OF THE PREFERRED EMBODIMENTS

Figure 2E:
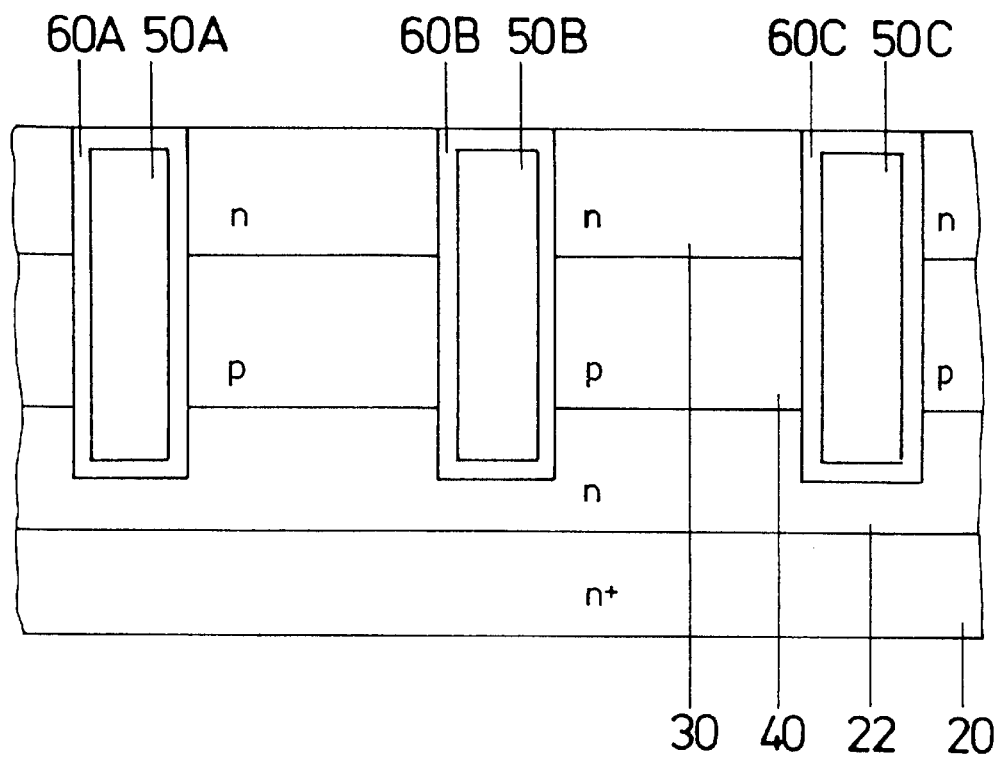

The semiconductor component according to the invention which can be controlled by means of the field effect will be explained in the following text with reference to an n-conductivity type MOSFET. Regions of the first conductivity type are n-doped regions in the following text, and regions of the second conductivity type are p-doped regions in the following text.

Referring now to the figures of the drawing in detail and first, particularly, to FIG. 1A thereof, there is shown a side view of a first exemplary embodiment of a semiconductor component according to the invention. The cross section pertains to a MOSFET.

The component according to the invention has a semiconductor body 1 with a heavily n-doped first connecting zone 20 as the drain zone, an n-doped second connecting zone 30 as the source zone, and a p-doped channel zone 40 which is formed between the drain zone 20 and the source zone 30. The drain zone 20, the channel zone 40 and the source zone 30 are arranged one above the other in the semiconductor body 1 in the exemplary embodiment shown in FIG. 1A. An n-doped drift zone 22, which is more weakly doped than the drain zone 20, is also formed between the drain zone 20 and the channel zone 40 in the exemplary embodiment.

The semiconductor component according to the invention shown in FIG. 1A also has a number of control electrodes 50A, 50B, 50C as gate electrodes, which are isolated from the semiconductor body 1 by means of insulation layers 60A, 60B, 60C, each extend in the vertical direction into the semiconductor body 1 and, at the same time, extend from the source zone 30 through the channel zone 40 to the drift zone 22. These gate electrodes 50A, 50B, 50C are connected to one another in a manner which is not illustrated in any more detail, so that they can be driven jointly. When a drive potential is applied to the gate electrodes 50A, 50B, 50C, a conductive channel is formed along the gate electrodes 50A, 50B, 50C in the channel zone 40, allowing a charge flow between the drain zone 20 and the source zone 30 when a voltage is applied between the drain zone 20 and the source zone 30. The withstand voltage of the component in this case rises with the number of gate electrodes along which conductive channels can be formed. Thus, as is illustrated in FIG. 1A, there are advantageously a number of gate electrodes 50A, 50B, 50C. However, correct operation of the component is ensured just by a component which has only one of the gate electrodes shown in FIG. 1A.

Figure 3:
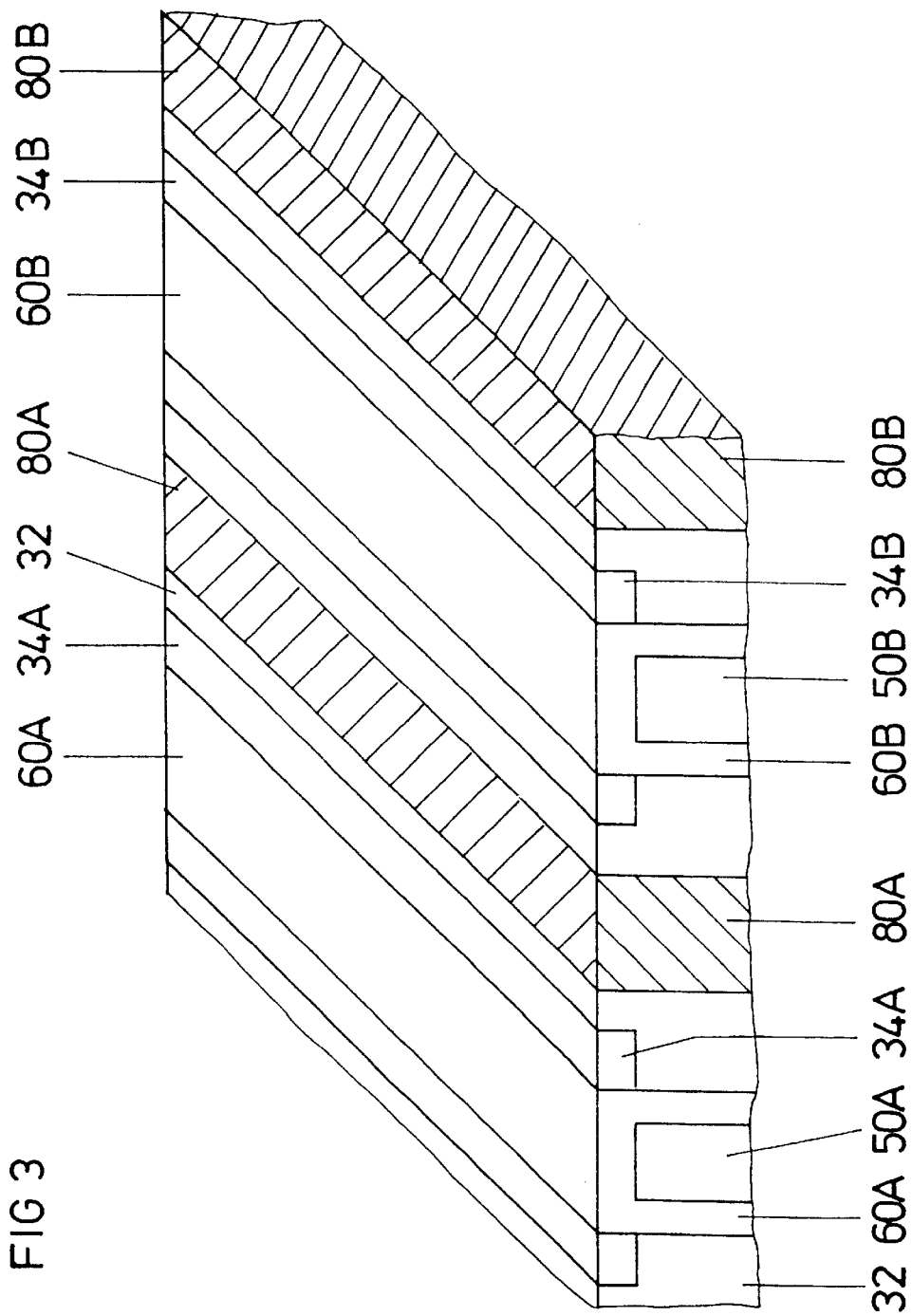
FIG. 3 is a perspective view of a detail of the semiconductor component according to the invention.

The gate electrodes 50A, 50B, 50C are formed, preferably as elongated elements, at right angles to the plane of the drawing in FIG. 1A, as can be seen from the perspective illustration of a detail of the semiconductor body in FIG. 3.

The semiconductor component according to the invention also has a recombination zone 80A, 80B, 80C, which is formed in the channel zone 40 and in the source zone 30. Three different embodiments of such recombination zones 80A, 80B, 80C are illustrated in the semiconductor component shown in FIG. 1A, which are arranged in trenches 82A, 82B, 82C in the semiconductor body 1 in the lateral direction of the semiconductor body 1, at a distance from the gate electrodes 50A, 50B, 50C.

The recombination zones 80A, 80B, 80C have a material which assists the recombination of p-charge carriers and n-charge carriers in the channel zone 40. One such material is, for example, a metal, in particular platinum.

In the recombination zone 80A, the side surfaces of the trench 82 which face the semiconductor body 1 are covered by a layer of recombination material. The rest of the trench in the recombination zone 80A is filled with a further material 802A, for example an insulation material.

In the recombination zone 80B, the trench 82B is completely filled with a recombination material, and in the recombination zone 80C, the trench 82C is partially filled with a recombination material, with the recombination zone 82C ending in the source zone 30 underneath one surface 11 of the semiconductor body 1, and with the trench 82C being covered on top of the recombination zone 82C by an insulation layer.

The filled trenches 82A, 82B, 82C are covered by insulation layers 90A, 90B, 90C. The insulation layers 90A, 90B, 90C cover the recombination zones 80A, 80B, 80C and parts of the source zone 30. Regions of the source zone 30 which are not covered by the insulation layers 90A, 90B, 90C have contact made with them by means of a source electrode 36.

The source zone 30 has a first doped region 32 and a second region 34A, 34B, 34C which is more strongly doped than the first doped region 32, with the more strongly doped second regions 34A, 34B, 34C being arranged at a distance from the recombination zone 80A, 80B, 80C, and with contact being made with them by means of a source electrode 36 applied to the semiconductor body 1. In the exemplary embodiment shown in FIG. 1A, there is no contact between the source electrode 36 and the second region 32.

In order to make contact with the drain zone 20, a drain electrode 24, for example a metal layer, is applied to a surface 12 of the semiconductor body 1 opposite the surface 11.

Figure 1B:
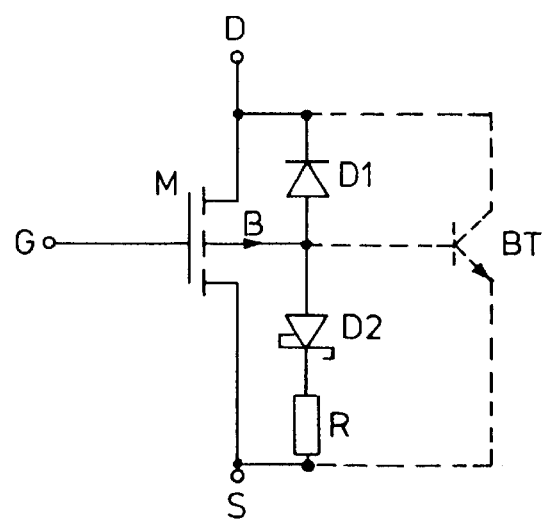
FIG. 1B is an electrical equivalent circuit of the semiconductor component according to the invention.

FIG. 1B shows an electrical equivalent circuit of the semiconductor component shown in FIG. 1A. This equivalent circuit has an ideal MOSFET M, whose drain connection D in the component shown in FIG. 1A is formed by the drain electrode 24, whose source electrode S is formed by the source electrode 36 in FIG. 1A, and whose gate electrode G is formed by the gate electrodes 50A, 50B, 50C in FIG. 1A. A bulk connection B for the ideal MOSFET M is formed by the channel zone 40 in FIG. 1A. A first diode D1 is formed between the bulk B and the drain D, and is formed by the pn junction between the channel zone 40 and the drift zone 22 in FIG. 1A. A second diode D2 between the bulk B and the source connection S is formed by the Schottky contact between the p-doped channel zone 40 and the recombination zone 80A, 80B, 80C, which is composed of metal, in FIG. 1A. The equivalent circuit has a resistor R between the Schottky diode D2 and the source connection S. The resistor R is formed by the metal/semiconductor junction between the recombination zone 80A, 80B, 80C and the source zone 32, 34A, 34B, 34C.

The sequence of the n-doped drain zone 20 with the drift zone 22, the p-doped channel zone 40 and the n-doped source zone 30 in the semiconductor component furthermore forms a parasitic npn bipolar transistor BT, which is represented by dashed lines in the equivalent circuit in FIG. 1B.

The method of operation of the semiconductor component according to the invention and as shown in FIG. 1 will be explained in the following text.

When a positive drive potential is applied to the gate electrodes 50A, 50B, 50C, an n-conductive channel between the source zone 30 and the drift zone 22 forms an n-conductive channel in the channel zone 40 along the insulation layers 60A, 60B, 60C. When a positive voltage is applied between the drain electrode 24 and the source electrode 36, this results in a charge flow from the drain zone 22, through the drift zone 22 and the conductive channel in the channel zone 40, into the source zone 30, and vice versa.

When the gate electrode 50A, 50B, 50C is not being driven by the application of a positive drive potential, then there is no conductive channel in the channel zone 40, and the semiconductor component is blocked by the pn junction, which is then reverse-biased, between the drift zone 22 and the channel zone 40.

When a positive voltage is applied between the source electrode S and the drain electrode D, the semiconductor component according to the invention is likewise blocked when no drive potential is applied to the gate electrode 50A, 50B, 50C. In this case, even though the pn junction between the channel zone 40 and the drift zone 22 is forward-biased, the Schottky junction between the recombination zone 80A, 80B, 80C and the p-doped channel zone 40 is in this case, however, reverse-biased, so that no charge carrier flow can take place from the heavily doped first region 34, the more weakly doped region 32 and the recombination zone 80A, 80B, 80C into the channel zone 40.

The recombination zone 80A, 80B, 80C also prevents the parasitic bipolar transistor, which is formed by the sequence of the drain zone 20, the drift zone 22, the channel zone 40 and the source zone 30, from being driven when the gate electrode 50A, 50B, 50C is not being driven and a positive voltage is applied between the drain electrode D and the source electrode S. In this case, p-charge carriers are injected into the channel zone 40. These p-charge carriers recombine on the surface of the metallic recombination zone 80A, 80B, 80C very quickly with the n-charge carriers (electrons) there, as a result of which the potential in the channel zone 40 cannot be increased sufficiently by the injected p-charge carriers to activate the parasitic bipolar transistor.

The semiconductor component according to the invention is thus blocked both when a forward voltage is applied in the forward direction, that is to say in the drain-source direction, and when a forward voltage is applied in the reverse direction, that is to say in the source-drain direction. The maximum blocking voltage in the forward direction in this case corresponds essentially to the blocking voltage which is also achieved in the MOSFET according to the prior art with a short circuit between the source zone and the channel zone. The blocking voltage in the rearward direction is lower than in the forward direction, and is governed by the blocking capability of the Schottky junction between the recombination zones 80A, 80B, 80C and the channel zone 40. The recombination zones 80A, 80B, 80C are preferably at least partially surrounded by a p-doped zone 42, which is more strongly doped than the rest of the channel zone 40, as illustrated for the recombination zone 80B in FIG. 1A.

The doping of the more strongly doped second regions 34A, 34B, 34C of the source zone 30 is preferably more than $10^{19}$ cm$^{-3}$. The doping of the second region 32 is preferably about $10^{15}$ cm$^{-3}$. The doping of the channel zone 40 apart from the more strongly doped region 42 is preferably $10^{16}$ cm$^{-3}$, and the doping of the drift zone is about $10^{15}$ cm$^{-3}$ or less.

The thickness of the drift zone 22 in the vertical direction of the semiconductor body is preferably more than 5 $\mu$m, the thickness of the channel zone 40 is between 2 and 5 $\mu$m, and the thickness of the source zone 30 is about 2 $\mu$m. The distance between the insulation layer 60A, 60B, 60C and the recombination zone 80A, 80B, 80C is between approximately 1 and 2 $\mu$m, the width of the recombination zones 80A, 80B, 80C in the lateral direction of the semiconductor body 1 is about 1 to 2 $\mu$m. The thickness of the insulation layers toward the channel zone 40 is preferably less than 0.1 $\mu$m.

A method for producing a semiconductor component according to the invention will be explained in the following text with reference to FIGS. 2A to 2I.

Figure 2A:
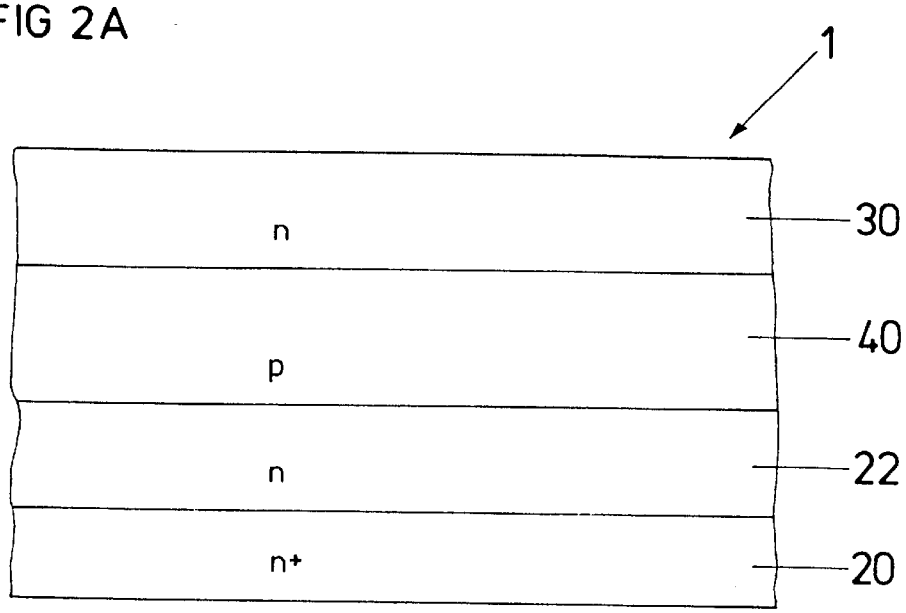

In a first method step, the result of which is illustrated in FIG. 2A, a semiconductor body 1 is provided, which has an n-doped first connecting zone 20 for forming a subsequent drain zone, a second n-doped connecting zone 30 for forming a subsequent source zone, and a channel zone 40 which is formed between the first connecting zone 20 and the second connecting zone. In the exemplary embodiment, a drift zone 22 is also formed between the channel zone 40 and the first connecting zone 20 and this is more weakly doped than the first connecting zone 20. The semiconductor body illustrated in FIG. 2A can be produced by means of conventional methods known from semiconductor technology.

Figure 2B:
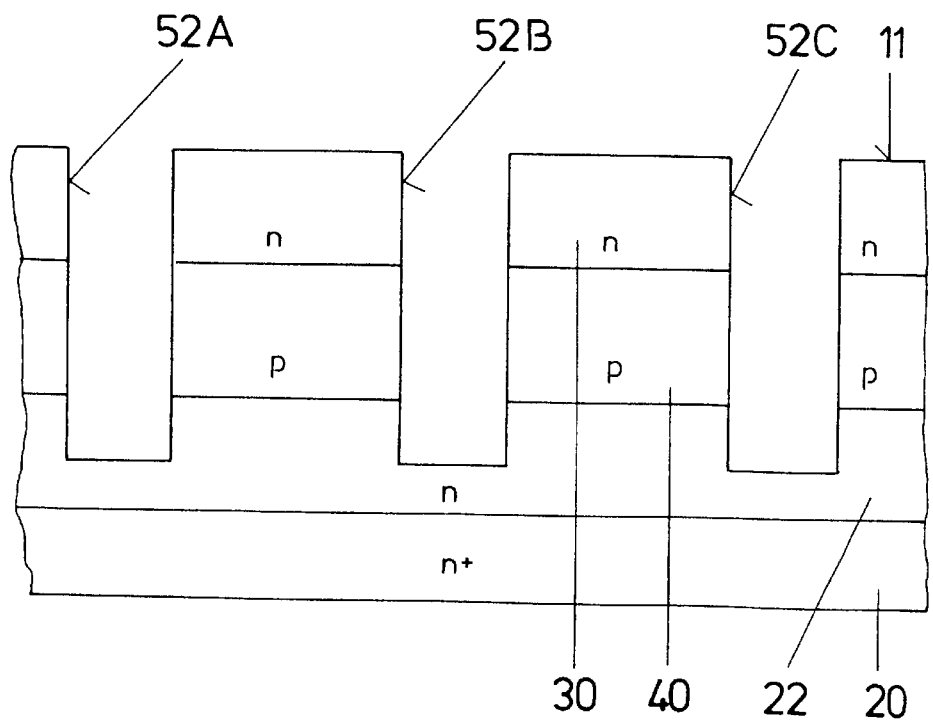
Figure 2C:
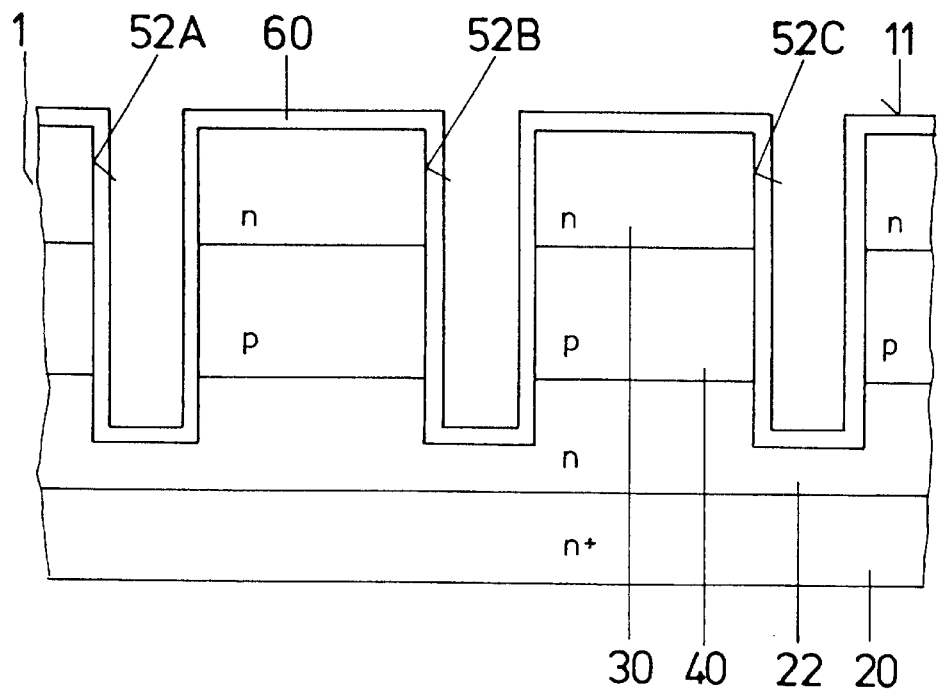

In a next method step, whose result is illustrated in FIG. 2B, trenches 52A, 52B, 52C are incorporated in the semiconductor body 1, starting from a surface 11 of the semiconductor body 1, and, starting from the surface 11, extend through the second connecting zone 30, and the channel zone 40 into the drift zone 22. The trenches 52A, 52B, 52C wherein gate electrodes will subsequently be formed may, for example, be produced in a known manner by means of an ion etching method. FIG. 2C shows the semiconductor body after a next method step, wherein an insulation layer 60 has been deposited on the semiconductor body 1. In the exemplary embodiment shown in FIG. 2B, the insulation layer 60 covers both the surface 11 and regions of the semiconductor body 1 which are exposed in the trenches 52A, 52B, 52C. The insulation layer 60 is composed, for example, of a semiconductor oxide, and is preferably produced by means of a temperature method, wherein the surface of the semiconductor body 1 is oxidized.

Figure 2D:
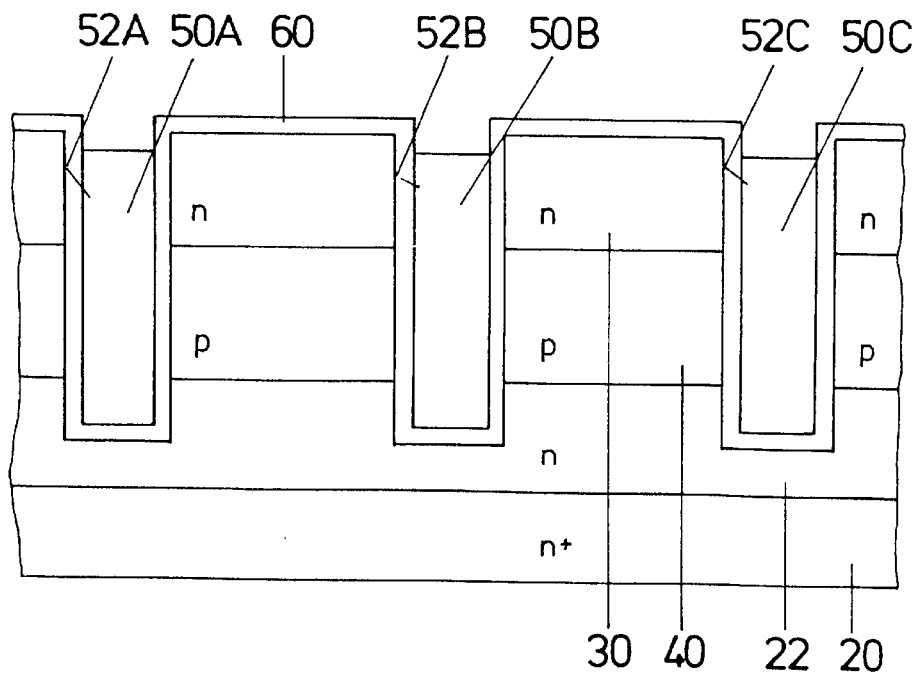

FIG. 2D shows the semiconductor body after a next method step, wherein electrode material 50A, 50B, 50C has been introduced into the trenches 52A, 52B, 52C. This electrode material is, for example, a heavily doped n-conductive or p-conductive semiconductor material, which is deposited into the trenches by means of known methods.

FIG. 2E shows the semiconductor body 1 after next method steps, wherein an insulation layer is applied to regions of the electrodes 50A, 50B, 50C which are exposed at the top, and the rest of the insulation material is removed from the surface 11 of the semiconductor body 1. This method step results in electrodes 50A, 50B, 50c, which are surrounded by an insulation layer 60A, 60B, 60C both toward the semiconductor body 1 and at the top. The insulation layer 60A, 60B, 60C, which is applied above the electrodes 50A, 50B, 50C, is preferably likewise composed of a semiconductor oxide, and can be produced by means of a temperature method.

In a next method step, whose result is shown in FIG. 2F, further trenches 82A, 82B, 82C are incorporated into the semiconductor body 1 starting from the surface 11, with these trenches 82A, 82B, 82C extending in the vertical direction of the semiconductor body 1 into the channel zone 40.

In a next method step, a material which assists the recombination of p-charge carriers and n-charge carriers, for example a metal, is introduced into the trenches 82A, 82B, 82C. To this end, according to a first embodiment of the method, the trench 82B is completely filled with the recombination material, as illustrated by the recombination zone 80B produced by means of such a method. A further embodiment of the method according to the invention provides for only those surfaces of the trench 82A which face the semiconductor body 1 to be covered with a recombination material 801A, and for the trench to be filled with a different material, for example an insulation material 802A, as shown by the recombination zone 80A, which has been produced by means of said method.

A further embodiment of the invention provides for the trench 82C to be only partially filled with a recombination material 80C, and for the section of the trench 82C which then still remains above the recombination material to be filled with a further material, for example an insulation material 92C, as is shown by the recombination zone 80C, which is produced by means of such a method.

Figure 2H:
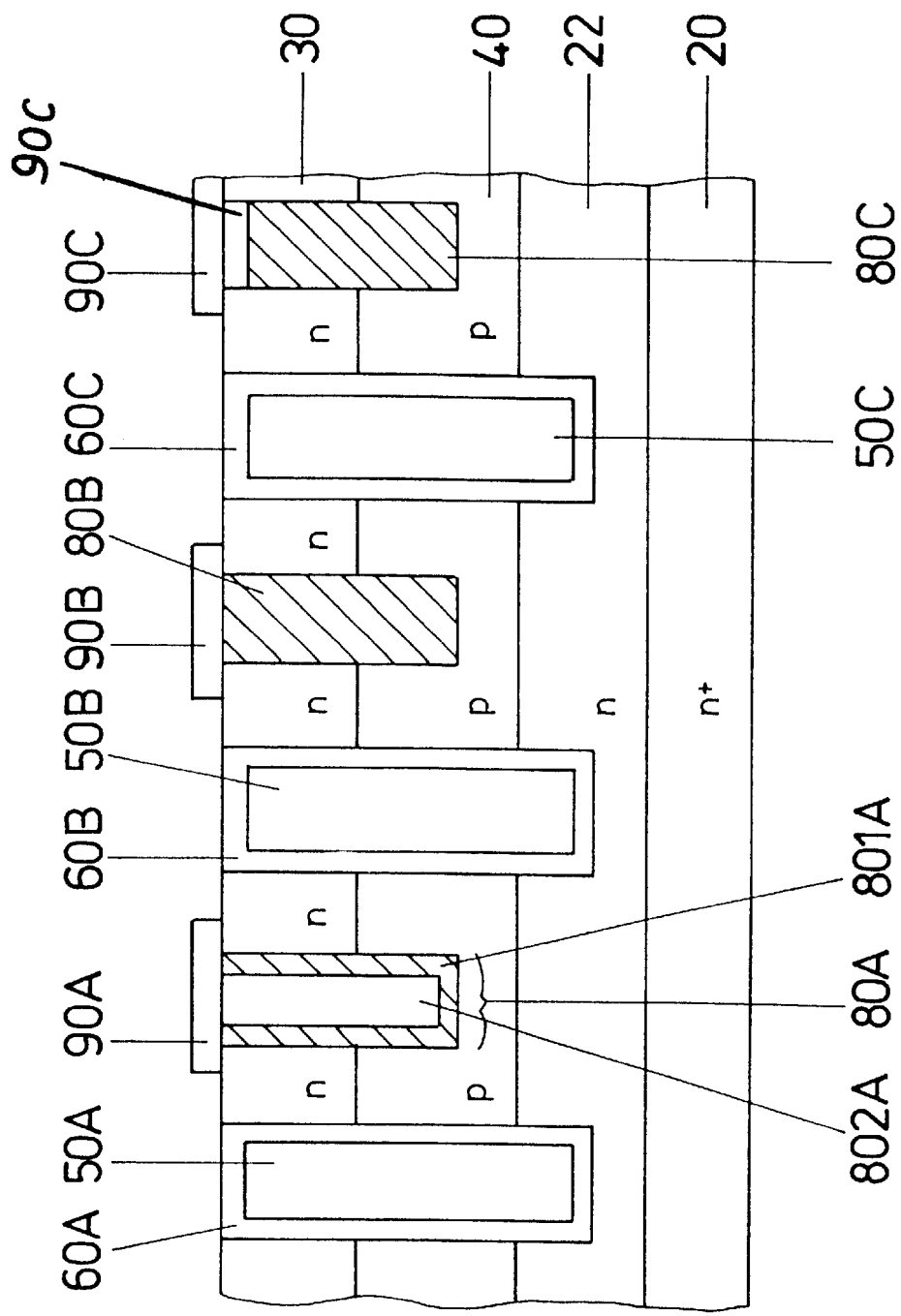

In a next method step, whose result is shown in FIG. 2H, the insulation layers 90A, 90B, 90C are produced above the recombination zones 80A, 80B, 80C on the surface 11 of the semiconductor body 1 by means of known methods, with these insulation zones 90A, 90B, 90C also partially covering the second connecting zones 30. These insulation layers are produced, for example, by depositing a layer of insulation material onto the surface 11 of the semiconductor body 1, after which this layer is partially removed by means of an etching method, in conjunction with a photolithography technique.

These insulation layers 90A, 90B, 90C isolate the recombination zones from a source electrode, which will be produced later, and are used in a subsequent method step, whose result is illustrated in FIG. 2I, as a mask for producing strongly n-doped regions 34A, 34B, 34C in the second connecting zone 30. These regions 34A, 34B, 34C can be produced by means of known diffusion methods or implantation methods, wherein n-charge carriers are doped into exposed regions of the semiconductor body 1.

In next method steps, an electrode 36 is applied to the surface 11 of the semiconductor body 1, and a second electrode 34 is applied to a surface 12 of the semiconductor body 1, opposite the surface 11, in order to produce the semiconductor component according to the invention as shown in FIG. 1A.

A further trench, which is not illustrated in any more detail, is preferably formed in the semiconductor body in order to make it possible to drive the gate electrodes 50A, 50B, 50C jointly, and this trench runs at right angles to the trenches of the gate electrodes, in order to connect the gate electrodes.

I claim:

1. A field effect-controlled semiconductor component, comprising:
   a semiconductor body having a first connecting zone and a second connecting zone of a first conductivity type, and having a channel zone of a second conductivity type formed between said first connecting zone and said second connecting zone;
   a control electrode adjacent said channel zone and isolated from said semiconductor body; and
   a recombination zone disposed in a trench extending into said semiconductor body in said channel zone and in said second connecting zone and having a recombination material assisting in a recombination of charge carriers of the first and the second conductivity types, said trench being at least partially filled with a recombination material.

2. The semiconductor component according to claim 1, wherein said recombination zone includes a metal.

3. The semiconductor component according to claim 2, wherein said metal is platinum.

4. The semiconductor component according to claim 1, wherein said first connecting zone, said channel zone, and said second connecting zone are arranged above one another.

5. The semiconductor component according to claim 1, which comprises a drift zone, more weakly doped than said first connecting zone, of the first conductivity type and formed between said first connecting zone and said channel zone.

6. The semiconductor component according to claim 1, wherein said control electrode extends in a substantially vertical direction into said semiconductor body.

7. The semiconductor component according to claim 1, wherein said recombination zone extends in a substantially vertical direction into said semiconductor body.

8. The semiconductor component according to claim 1, wherein said recombination zone is formed in a trench formed in said semiconductor body, and said trench is completely filled with said recombination material.

9. The semiconductor component according to claim 1, wherein said recombination zone is formed in a trench formed in said semiconductor body, and said trench has surfaces facing said semiconductor body covered with said recombination material.

10. The semiconductor component according to claim 1, wherein said recombination zone is formed in a trench formed in said semiconductor body, said trench is filled with said recombination material, and said recombination zone ends underneath a surface of said semiconductor body.

11. The semiconductor component according to claim 1, wherein said second connecting zone has a doped first region and a doped second region doped more weakly than said first region, and wherein said first region is formed at a distance from said recombination zone.

12. The semiconductor component according to claim 11, wherein said second region is disposed between said first region and said channel zone.

13. The semiconductor component according to claim 1, which comprises a first electrode connected to said first connecting zone.

14. The semiconductor component according to claim 1, which comprises an electrode connected to said second connecting zone, and an insulation layer insulating the electrode from said recombination zone.

15. The semiconductor component according to claim 14, wherein said electrode is connected exclusively to said first regions of said second connecting zone.

* * * * *